United States Patent [19]

Trinh

[11] Patent Number: 5,265,266
[45] Date of Patent: Nov. 23, 1993

[54] RESISTIVE PLANAR STAR DOUBLE-BALANCED MIXER

[75] Inventor: Trang N. Trinh, Cypress, Calif.

[73] Assignee: Rockwell International Corporation, Seal Beach, Calif.

[21] Appl. No.: 679,400

[22] Filed: Apr. 2, 1991

[51] Int. Cl.$^5$ ............................................. H04B 1/26
[52] U.S. Cl. ................................................. 455/326
[58] Field of Search ........................ 455/326, 327, 328

[56] References Cited

U.S. PATENT DOCUMENTS

| | | | |
|---|---|---|---|
| 3,678,395 | 7/1972 | Hunton et al. | 455/326 |
| 4,485,488 | 11/1984 | Houdart | 455/327 |
| 4,739,519 | 4/1989 | Findley | 455/327 |

OTHER PUBLICATIONS

*Broadband Double Balanced Mixer/Modulators* Part I R. B. Mouw and S. M. Fukuchi, The Microwave Journal, vol. 12, No. 3, Mar. 1969, pp. 131–134.

*Decade-Band Mixer Covers 3.5 to 35 GHz* M. A. Smith, K. J. Anderson, and A. M. Pavio, The Microwave Journal, vol. 29, No. 2, Feb. 1986, pp. 163–171.

Primary Examiner—Gregory C. Issing
Attorney, Agent, or Firm—H. Fredrick Hamann; George A. Montanye; Tom Streeter

[57] ABSTRACT

A passive uniplanar double-balanced star RF mixer, comprising a substantially planar support substrate with a conductive layer of material disposed on one side and a slotline and first, second, and third coplanar waveguides formed therein which are configured to accommodate different frequencies. The first waveguide is bifurcated on one end into two waveguide branches which form first and second waveguide terminations each physically coupled to one end of the slotline. The second waveguide is electrically coupled to the first waveguide at a location spaced apart from the branches. The third waveguide is electrically coupled to the slotline at a position located approximately equi-distant from the slotline ends. A first grounding element is connected to the grounds of the first and third waveguides, and is positioned adjacent to the first branch termination. A conductive surface is enclosed by the waveguide branches and the slotline. This enclosed conductive surface has its smallest planar dimension large relative to the width of the slotline. The enclosed surface is further connected to the first and second grounding element across the coplanar waveguide branches. A second grounding element is connected to the grounds for the second and third waveguides, and is positioned adjacent to the second branch termination. First and second diodes are connected by a cathode to the center conductor of the first waveguide first end termination and at an anode to the first grounding element and the enclosed conductive surface. Third and fourth diodes are connected by an anode to the center conductor of the first waveguide the second end termination and at cathodes to the second grounding element and the enclosed conductive surface.

19 Claims, 7 Drawing Sheets

RESISTIVE PLANAR STAR DOUBLE-BALANCED MIXER

BACKGROUND OF THE INVENTION

1. Field of the Invention

The present invention relates to radio frequency transmission and reception circuits and radio frequency mixers, and more particularly to an apparatus for mixing intermediate or radio frequency signals with local oscillator signals on a planar substrate. The invention further relates to star-type double-balanced mixer for performing very high radio frequency mixing in a uniplanar monolithic integrated circuit.

2. Related Technical Art

A variety of Radio Frequency (RF) mixers have been developed to facilitate combining a local reference oscillator output with either an intermediate frequency source or a radio frequency source for performing a desired up or down conversion. Mixers form the key link between RF antennas and processing or decoding circuits. In many applications, such as for advanced Monolithic Microwave Integrated Circuits (MMICs), the desire is to greatly reduce the size of mixers and related processing components to meet volumetric limitations otherwise addressed by MMIC elements, and further, to minimize power consumption.

One mixer configuration finding use in planar applications is a ring-type configuration Double Balanced Mixer (DBM) which allows more flexibility in component interconnection. An example of this type of mixer circuit is found in the article *Broadband Double Balanced Mixer/Modulators* by R. B. Mouse and S. M. Fukuchi, published in the Microwave Journal, pages 133-134, March 1969. Currently, most MMIC type DBMs utilize Field-Effect Transistors (FETS) and lumped-element baluns due to the difficulty in realizing a microwave balun to feed a planar star of Schottky diodes. Unfortunately, this type of mixer usually exhibits a narrow bandwidth due to elaborate matching requirements and is also relatively unstable due to temperature variations.

To create broadband mixing structures requires the use of active baluns having several FETs in a distributed configuration which is large in size and requires large DC power supplies. FET active baluns also introduce additional noise into MMIC double balanced mixers which degrades their performance.

Current planar designs for planar ring-type double-balanced mixers also require fabricating the Schottky diodes and other circuit elements on both sides of a support/base substrate. The assembly is then inserted into a waveguide channel for operation. This type of construction makes these mixers unsuitable for uniplanar or true monolithic integrated circuit applications.

Another type of double-balanced mixer useful in advanced RF applications is the star-type configuration double-balanced mixer, also discussed in the above-referenced article. There are currently no high performance passive uniplanar double-balanced mixers using Schottky diodes in a star configuration available for microwave or other very high frequency applications. There are currently no designs of this type of mixer which are readily useful for MMIC fabrication techniques.

What is needed is an apparatus or technique for manufacturing a uniplanar broadband star-type double-balanced RF mixer. It would be extremely advantageous if the mixer could be manufactured using known monolithic circuit fabrication techniques, such as employed in conventional MMIC applications. The mixer should provide low loss, MMIC compatible, operation.

SUMMARY

In view of the limitations and problems found in the art, it is one purpose of the present invention to provide a double-balanced star-type RF signal mixer structure capable of being manufactured as a single-sided (uniplanar) monolithic component.

One advantage of the present invention is that it provides highly compact and non-complex monolithic mixer structures that can be mass manufactured using conventional techniques.

Another advantage of the present invention is that it operates over a large bandwidth.

The invention provides a double-balanced mixer, with its associated advantages, in a uniplanar star-type configuration.

These and other purposes, objects, and advantages of the invention are realized in a passive uniplanar double-balanced star-type RF mixer using a planar support substrate with a conductive material layer deposited on one surface, and a slotline, and first, second, and third coplanar coaxial waveguides formed therein which are configured to accommodate different frequencies of interest. An exemplary RF mixer uses a gallium arsenide substrate material with a conductive layer of silver, platinum/gold alloy, or gold.

The first coplanar waveguide is bifurcated on one end into two waveguide branches which form first and second waveguide terminations which are each physically coupled to one end of the slotline. The second coplanar waveguide is electrically coupled to the first waveguide at a preselected location near the non-branched end. The third coplanar waveguide is electrically coupled to the slotline at a position located approximately equidistant from the slotline ends. The grounds of the first and third coplanar waveguides, which are generally formed by conductive surfaces positioned adjacent to the first branch termination, are connected together. The grounds for the second and third coplanar waveguides, which are also formed by conductive surfaces positioned adjacent to the second branch termination, are connected together. First and second diodes are mounted adjacent to the end portion of the first waveguide termination and are connected by a cathode to the center conductor of the first waveguide branch and at an anode to a ground, each extending outward from the waveguide center conductor in opposite directions. Third and fourth diodes are mounted adjacent to the second waveguide termination and are connected by an anode to the center conductor of the second waveguide branch and at a cathode to a ground, each extending outward from the waveguide center conductor in opposite directions.

The ground for both the first and third coplanar waveguides generally comprises a first conductive surface on the substrate positioned adjacent to and extending between the first and third coplanar waveguides. The second ground element for the second and third coplanar waveguides comprises a second conductive surface on the substrate positioned adjacent to both the second and third coplanar waveguides. The slotline and the first coplanar waveguide branches enclose a third conductive surface which is further connected to the first and second conductive surfaces. The electrical connection of these surfaces is accomplished using a plurality of spaced apart conductive crossovers, such as gold ribbons, connected between the first and second conductive surface areas, and between the first and second conductive surface areas and the third conductive surface area. However, these crossovers do not connect opposing sides of the slotline together.

In a preferred embodiment, the slotline is formed as a semi-circular slot having a preselected radius and slot width determined by the frequencies and impedances of interest. This slotline is typically formed in a central region of the mixer and is used to transmit LO signals to the diodes. The branches of the first coaxial coplanar waveguide are formed as two arcuate coaxial waveguide segments or branches connected on one end to a first linear coaxial waveguide segment. This creates a semi-circular coplanar waveguide which is positioned on the opposite side of the slotline to transmit the RF signals to the diodes and to extract the IF signals from the diodes. Those skilled in the art will readily realize that these transmission lines can assume shapes, e.g. U-shaped, other than arcs or semi-circles. The first coplanar waveguide branches can be formed as second and third linear waveguide segments that each extend toward the slotline at an angle of 90 degrees or less from the first linear segment. Additional linear segments can be extended from these linear segments toward the slotline at angles of 90 degrees or less.

The second and third coplanar waveguides are generally configured as linear coaxial waveguide segments, although other configurations are allowable. A bridge of conductive material, an airbridge conductor, is connected on one end to the center conductor of the second coplanar waveguide and on a second end to the first coplanar waveguide center conductor, and a similar conductive bridge extends over the slotline and is connected between the center feed of the third coplanar waveguide and an opposing edge of the slotline. The coupling between the unbalanced coplanar waveguide and the balanced slotline is equivalent to a balun.

In an alternative embodiment, a second slotline is formed in the conductive layer in series with the third coplanar waveguide and is connected on one end to the first slotline at a position located approximately equidistant from the first slotline ends. The second slotline is electrically coupled to the center feed strip of the third coplanar waveguide near a second end. The second slotline is coupled to the third coplanar waveguide using a bridge of conductive material having one end connected to a center feed of the third coplanar waveguide, a central portion extending over the second slotline, and a second end connected to one of edge of the second slotline, creating a balun.

In another alternative embodiment, a waveguide E-Field probe is connected to the first coplanar waveguide as an input source and a tapered input channel formed in the conductive layer is coupled to a finline at a position located approximately equidistant from the finline ends. The tapered input channel has a wide, horn-like, first end for intercepting input LO signals and a narrower second end for coupling these signals to the finline. In this embodiment, the first ground element is connected to the ground of the first coplanar waveguide and is positioned adjacent to the first branch diode termination and the finline. The second ground element is connected to the ground of the second coplanar waveguide and is positioned adjacent to the second branch diode termination and the finline.

In further aspects of the invention, a capacitor of predetermined value is connected in series with the center conductor of the first coaxial waveguide to provide additional isolation and prevent signal loss for the IF signals. A second capacitor of predetermined value can also be connected in series with the center feed of the second coaxial waveguide to provide signal filtering.

BRIEF DESCRIPTION OF THE DRAWINGS

The novel features of the present invention may be better understood from the accompanying description when taken in conjunction with the accompanying drawings in which.

DESCRIPTION OF PREFERRED EMBODIMENTS

This invention provides a method and apparatus for achieving a high frequency, uniplanar, passive star-type, double-balanced mixer (DBM) that is suitable for hybrid or monolithic microwave integrated circuit (MMIC) applications. Diode pairs in the mixer structure are arranged to have a common node as in the typical star configuration. Radio Frequency (RF) signals in one desired frequency range are transferred to the diodes through a semi-circular coplanar waveguide (CPW) structure. Local Oscillation (LO) signals are coupled to the diodes through a semi-circular slotline structure which is physically coupled to the coplanar waveguide. However, the semi-circular shape is only illustrative and other configurations are possible. Intermediate Frequency (IF) signals are extracted from a position along the coplanar waveguide and transferred to other apparatus using a second coplanar waveguide. Gold-wire or ribbons extending across the coplanar waveguides maintain proper ground plane potentials for the mixer. All diodes and circuits are fabricated on the same side of the dielectric substrate to provide MMIC compatible fabrication capability.

The DBM configuration used in the manufacture of the present invention is a star type mixer in which four diodes each have one end connected to a common node. The common node is used as an IF output port and the other terminals of the four diodes are connected to RF and LO secondary transformer windings or baluns. An example of this mixer configuration is shown in FIG. 1.

Figure 1:
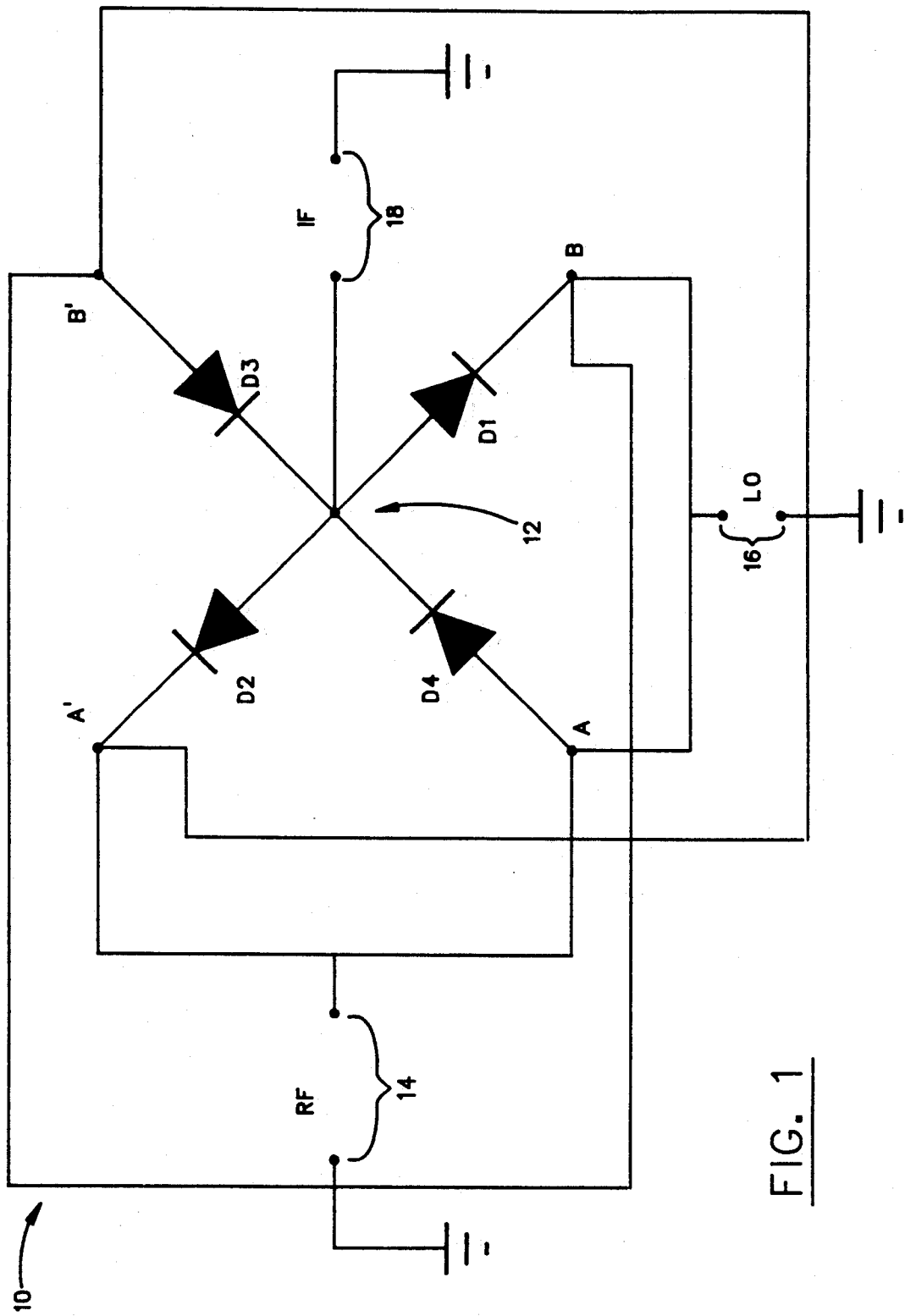
FIG. 1 illustrates a schematic of a double-balanced star-type mixer circuit.

FIG. 1 shows a schematic of a typical Double-Balanced Mixer (DBM) with a star diode configuration.

In FIG. 1, a DBM 10 uses four diodes, D1, D2, D3, and D4, to form a diode star with the diodes connected to a common node point 12. In this configuration the diodes D1 and D2 are connected through their respective anodes to the cathodes of the diodes D3 and D4.

The diode D1 is connected through its cathode to the LO input at a node labeled B. The diode D4 is connected through its anode to the LO input at a node labeled A. The diode D2 is connected through its cathode to a node that connects both the RF input/output and the LO ground, here labeled A'. The diode D3 is connected through its anode to a node labeled B' which serves as both RF and LO ground.

The RF input/output is accomplished by connecting an RF input or output apparatus across the terminals 14. The LO input is achieved by connecting a local oscillator signal source across the terminals 16. The IF output or modulation is accomplished by connection to the terminals 18 which transfer IF signals to or from the node 12. When RF signals are applied across the terminal 14, nodes A and A' have the same RF potential due to the circuit connection as shown in FIG. 1. The RF potential at node B is also identical to that of B'. However, A/A' has opposite polarity to that of B/B' since they are connected to opposite electrodes of the RF terminals. Assuming that all four diodes are identical, and the LO circuitry is symmetrical about its input terminal 16, then node 12 and the LO terminal 16 are virtual ground points for the RF signals. Therefore, in the schematic shown in FIG. 1, RF terminal 14 is located at the LO virtual ground, and the LO terminal 16 is located at the RF virtual ground, ensuring a good LO to RF isolation.

Figure 3:
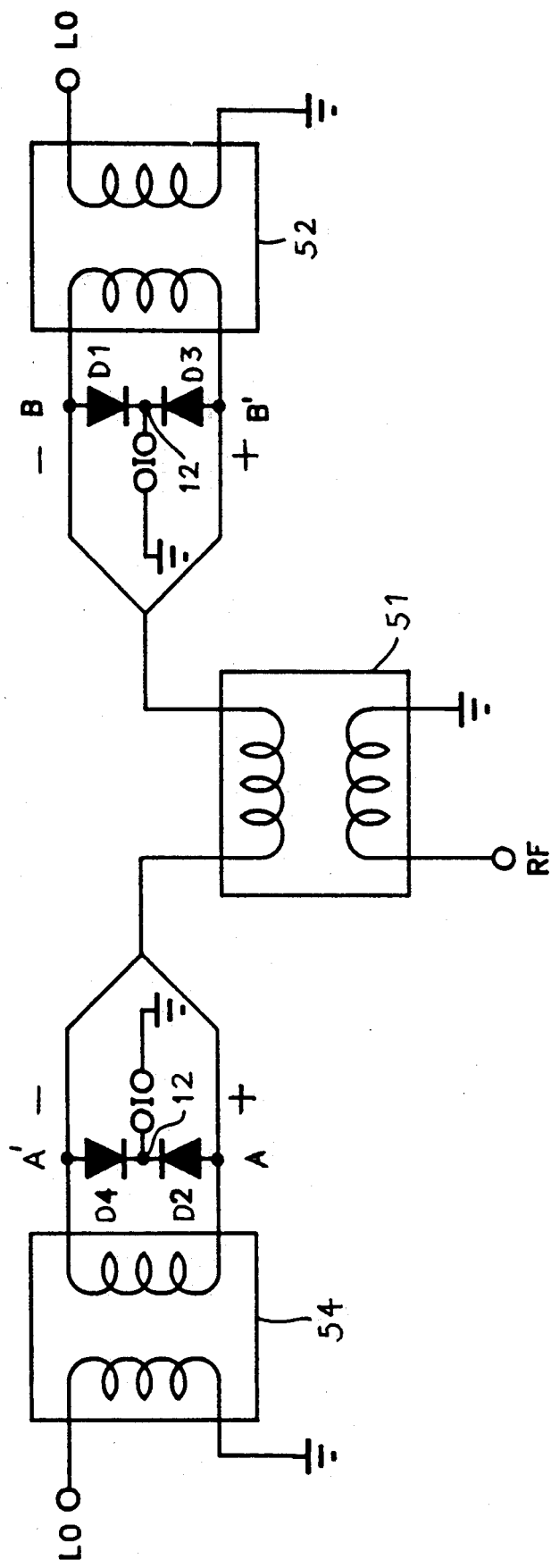
FIG. 3 illustrates an equivalent circuit for the mixer of FIG. 2.
Figure 4A:
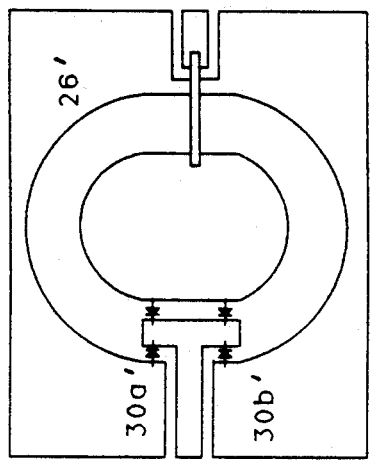
FIG. 4a–4f illustrates alternative coplanar waveguide and slotline configurations found useful in the mixer of FIG. 2.
Figure 4B:
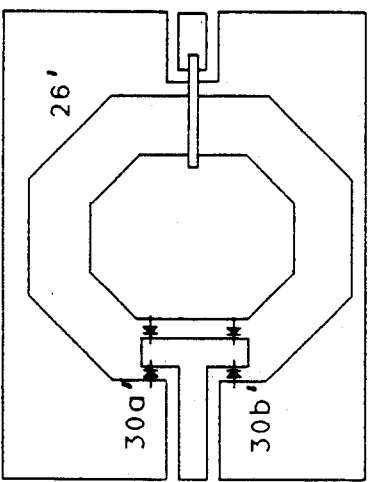
Figure 4C:
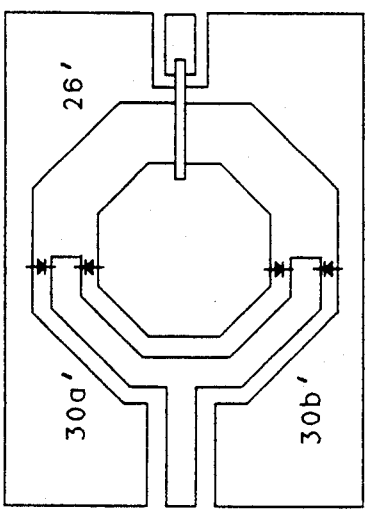
Figure 4D:
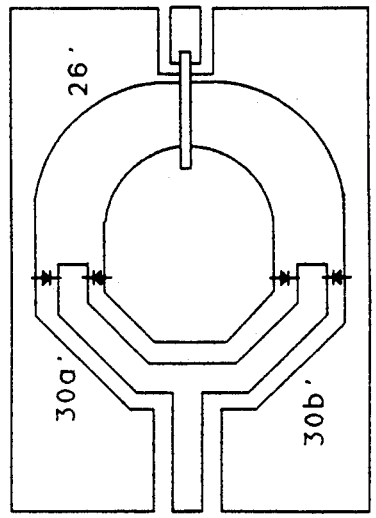
Figure 4E:
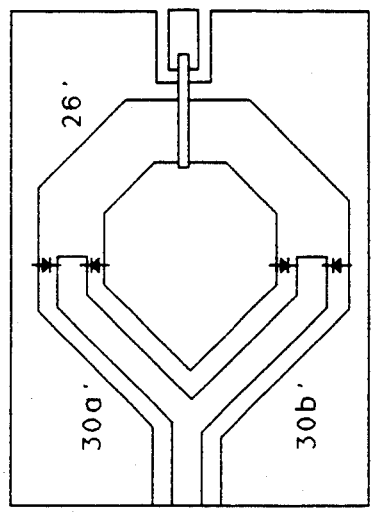
Figure 4F:
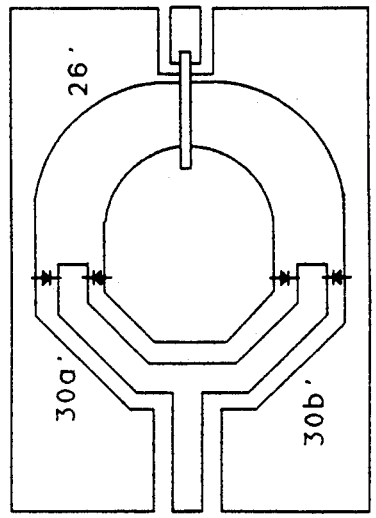

In this configuration, each pair of diodes acts as a polarity reversing switch. When a LO signal is applied to the node 12, the diode pairs D1/D3 and D2/D4 are alternatively switched on and off. During one LO signal half-cycle when diodes D1 and D3 are on, the diodes in the pair D2/D4, are off. The same operation is repeated during the next LO signal half-cycle when the diode pair D2/D4 is on. When D1/D3 are on, D2 and D4 are open-circuited, and the mixing occurs only in D1 and D3. During the other LO signal half-cycle, the mixing occurs in the D2 and D4 diodes. This characteristic resembles that of two single-balanced mixers (SBMS) connected in parallel with a common IF output connected to node 12, as shown in FIG. 3. Each SBM produces an IF output during alternate half-cycles of the LO signal.

While the circuit of FIG. 1 serves some applications adequately, it is very impractical for many desired planar applications. Conventional star DBMs are inherently non-planar and do not lend themselves to monolithic fabrication techniques. Therefore, the present invention provides a new DBM structure in which planar baluns replace the conventional RF and LO signal transformers. This new structure utilizes coplanar waveguides and slotline conductors to perform the input/output and mixing functions of the DBM.

Figure 2:
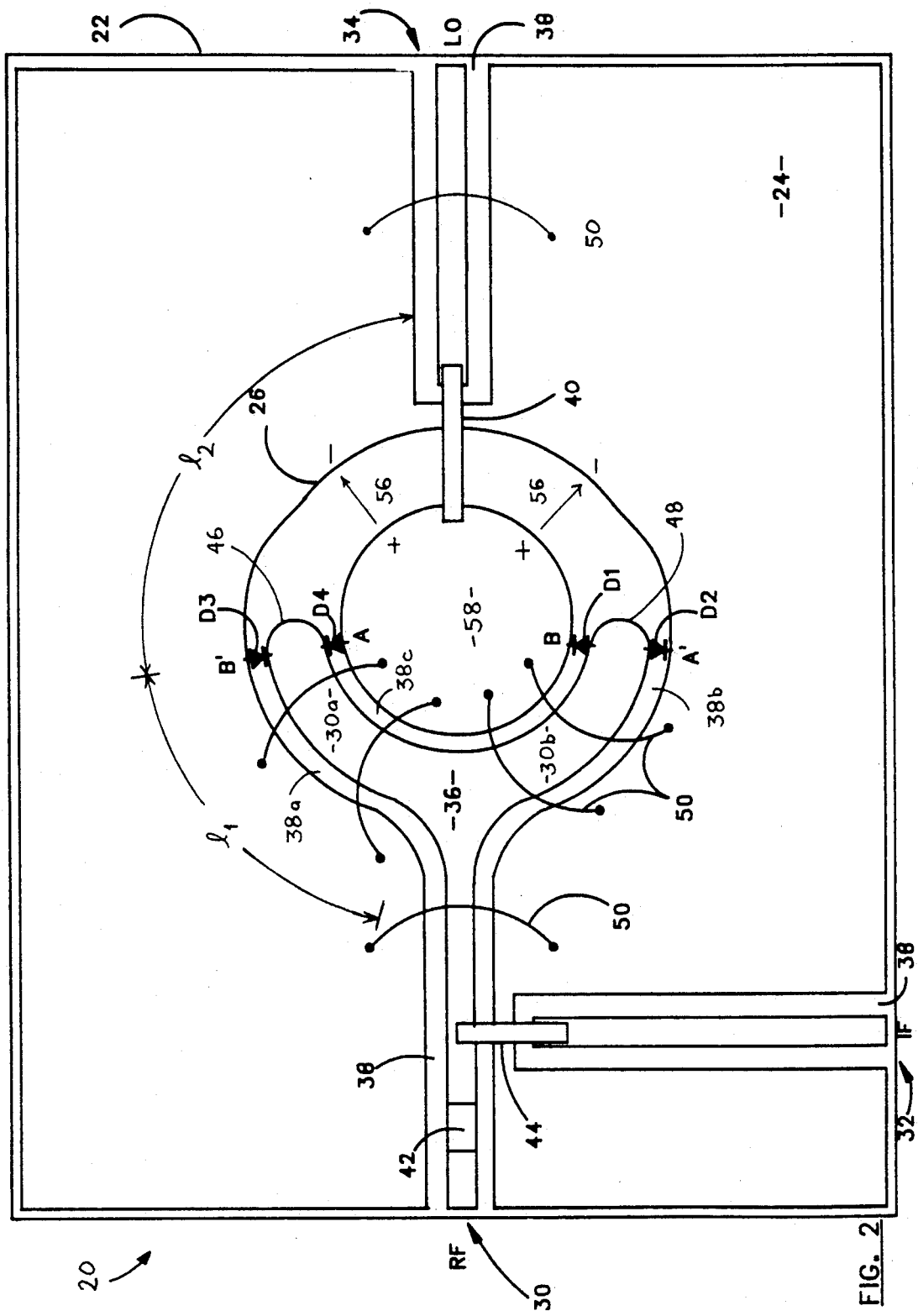
FIG. 2 illustrates a perspective view of a double-balanced star mixer as constructed according to the present invention.

A double-balanced mixer 20 constructed according to the teachings of the present invention is illustrated in the top view of FIG. 2. In FIG. 2, a base support or circuit substrate 22 is used on which the mixer structure is manufactured. The planar substrate 22 comprises one of a variety of suitable insulating materials that are compatible with the fabrication process chosen for mixer construction. The substrate 22 material is also chosen to be compatible with the manufacture of MMIC type components and circuit elements, i.e. doping, implantation, etc., so that a common substrate can be employed for a monolithic architecture. This allows manufacture of the mixer 20 as an integral part of larger monolithic circuits or using common processing methodology.

An exemplary substrate material is GaAs. However, those skilled in the art will readily appreciate that other semiconductor or insulating material such as, but not limited to, silicon or ceramic may be used within the teachings of the present invention for the manufacture of the substrate 22. The dimensions of the substrate 22 are obviously determined by the required voltage isolation and standoff requirements for metallic or ground layers, amount of circuitry to be integrated with the mixer 20, the mixer dimensions required to accommodate a frequency range of interest, application specific size constraints, and other known criteria.

A thin layer of metal or conductive material 24 is deposited on one side of the substrate 22 on which the various features of the mixer 20 are formed. Where desired, an additional layer of metal or metallization, not shown, can be deposited on a second, opposing, side of the substrate 22 of the mixer circuit 20 to form a surface useful for attaching or soldering to a circuit, mother, board. Those skilled in the art will readily appreciate that the substrate 22 can itself comprise several material layers and that a metal layer can be positioned within the multi-layer structure where desired so that semiconductor or insulating material forms the bottom most extent of the mixer 20. However, additional metal layers are not necessary to the operation of the mixer since, in a uniplanar design, all conductors and grounds are realized within the conductive layer 24 only.

The conductive or metal layer 24 can comprise a variety of materials known to those skilled in the art. The conductive layer 24 typically comprises a material such as silver, platinum/gold alloy, or gold, although other conductive materials are also suitable. Those skilled in the art will readily understand the dimensions, thickness, required for the layer 24 to achieve desirable impedances and inductances for given applied voltages and frequencies.

The metal layer 24 has an arcuate or semi-circular slotline conductor 26 etched, or otherwise formed during metal deposition, centrally located on the substrate 22 surface. The location need not be precisely centered but is illustrated as fairly close to center in this embodiment due to the presence of other circuit features, as well as distances required for establishing appropriate circuit isolation. The shape of the slotline 26 is dependent upon such parameters as the desired operating frequency range which determines its size, and areal constraints placed on the metal layer 24 by a specific application. In general, the shape of the slotline can be arbitrary at lower frequencies. At higher operating frequencies, the slotline should have an arcuate or semi-circular shape to minimize circuit discontinuities which might degrade the RF performance. The length $l_1$ of the coplanar waveguide (CPW) sections and the length $l_2$ of the slotline sections can be chosen independently of each other and are generally determined by areal constraints placed on the circuit by a specific application.

The slotline 26 is made wide enough to accommodate a preselected impedance at a particular operating frequency, or frequency range, for the mixer 20, as would be readily apparent to those skilled in the art. An exemplary dimension which is applicable to frequencies between about 20 and 40 GHz, is on the order of 60 μm in width on a 0.5 mm thick GaAs substrate. However, this dimension can be adjusted accordingly, especially where optimization for fixed frequency applications is desired so as to minimize reflection and other degrading effects. The slot impedance is determined, in general, by the impedance of the diodes at the LO frequency as will be apparent to those skilled in the art.

Three coaxial coplanar signal waveguides 30, 32, and 34 are also provided in the metal layer 24. They are used for RF, IF, and LO signal transfer, respectively. The coplanar waveguide 30 is split at a T-junction 36 into two separate coplanar waveguides 30a and 30b, through which the RF signal is transferred to the diodes D1, D2, D3, and D4. Similarly, the LO signal in the CPW 34 is equally divided into two signals via a coplanar waveguide-to-slotline junction 40. The LO signals carried by the slotline 26 are transferred to the diode pairs D1/D2 and D3/D4, respectively.

The coplanar waveguide-to-slotline transition is realized by connecting the center conductor of the coplanar waveguide 34 to one edge of the slotline via a metal bridge or gold ribbon while connecting the ground of the CPW 34 to the other edge of the slotline 26. Gold ribbons 50 connect the grounds of all coplanar waveguides transmission lines together to ensure that the ground planes on either side of each coplanar waveguide have identical ground potentials. Note that there should be no gold bridge across a slotline since this will short circuit the slotline. If the electrical length of the coplanar waveguide sections 30a and 30b are small compared to the waveguide wavelength at IF frequencies, then these sections are considered as a single node similar to the node 12 in FIG. 1. Therefore, the IF signal can be extracted from the coplanar waveguide 32 via the coplanar waveguides 30a and 30b.

Gold material bridges placed 50 across the coplanar waveguides 30a and 30b assure that IF grounds are properly maintained across the transmission lines 30a and 30b. For simplicity in circuit management, both RF and IF signals share a short segment of coplanar waveguide 30 near the junction 36. A parallel-plate capacitor 42 positioned on waveguide 30 prevents the IF signal from escaping through the RF port. RF-to-IF signal isolation is realized by external filtering at the IF port. The RF-to-IF isolation is, therefore, determined mostly by the rejection level of the IF filter as would be apparent to those skilled in the art, and is not discussed here.

Exemplary fabrication techniques for the waveguides include surface masking to prevent or preferentially direct metal deposition, or post deposition etching of isolation gaps or slots 38. The separation between the center conductor strip and the lateral ground determines the impedance of each coplanar waveguide. The dimensions of the gaps 38 used to define the waveguides are determined, in part, by the desired DBM application frequency and the impedance level of the diodes. However, the present apparatus is fairly broadband in nature and does not require physical readjustment for efficient use at frequencies within a preselected broad design envelope. Typical dimensions for the center conductor width and ground separation are on the order of 30 and 22 μm, respectively, on a 0.25 mm thick GaAs substrate, operating at 10 GHz. However, these dimensions are only exemplary and can be changed to a different combination by those skilled in the art to match specific applications.

In FIG. 2, the waveguides 30, 32 and 34, terminate on one end adjacent an outer edge of the mixer structure 20. This allows a terminal position for connecting external signal sources through bond wires, ribbons, or small coaxial signal cables. Of course, the waveguides can be connected more directly to other components on a larger monolithic circuit structure by extension of the waveguide conductors or through interfacing with other planar conductive strips.

As in the DBM circuit 10 of FIG. 1, the mixer 20 uses each pair of diodes as polarity reversing switches. A LO signal is transferred along the coplanar waveguide-to-slotline T-junction 40 and through the slotline 26 to the diode pairs D1/D3 and D2/D4, which are alternatively switched on and off in response to the half-cycle changes in the LO signal. During one LO half-cycle the diodes D1 and D3 are on and the diodes D2 and D4 are off. The same operation is repeated in the next LO half-cycle when the diodes D2 and D4 are on, and the diodes D1 and D3 are off.

During operation, RF signals arrive at each diode pair via the coplanar waveguide 30, distributed through the T-junction 36, in phase. The LO signals, on the other hand arrive at each diode pair 180° out of phase. The effect of these signal patterns is similar to two single-balanced mixers (SBMs) using 180° hybrid couplers connected in parallel. An equivalent circuit for the one illustrated in FIG. 2 is shown in FIG. 3.

In FIG. 3, the diodes D1 and D3 are employed in one single balanced mixer section 52 and the diodes D2 and D4 in another single balanced mixer section 54, each operating during the opposite half-cycles of the LO signal. Therefore, the IF signal is collected during both cycles of the LO signal. The RF and LO transformers replicate the operations of the coplanar waveguide T-junction 36 and coplanar waveguide-to-slotline T-junction 40, respectively. The IF signals are tapped off from a common node 12 in FIG. 3, as in FIG. 1 (or 36 in FIG. 2).

Returning to FIG. 2, the waveguide 30 makes a transition from a linear waveguide region to an arcuate or semi-circular waveguide region at the T-junction 36. The dimensions of the semi-circular portion formed by the sections 30a and 30b, in terms of radius of curvature, are not critical. These dimensions are determined by factors such as creating a smooth transition to avoid reflections or other deleterious effects, process specific limitations in manufacturing the waveguide, and the areal constraints of the circuits. It is not necessary for the arcuate portion of the waveguide 30 (30a and 30b) to form an exact semi-circle. Other shapes can be employed including, but not limited to, paraboloid, V shaped, U shaped, etc.

An example of other acceptable shapes for the waveguide sections 30a' and 30b' are illustrated in FIGS. 4a through 4f. These waveguide and slotline configurations include straight waveguide segments 30a and 30b extending outward at angles equal to or less than 90 degrees from the straight segment 30', while the slotline 26' is either elliptical or rectangular in nature. It will be apparent to those skilled in the art that the present invention provides increased flexibility in circuit design. However, a smooth transition region is desired, as well as presentation of each diode central axis substantially orthogonal to the LO signals. Therefore, the ends of the waveguide sections 30a' and 30b' connecting with the slotline 26' should be aligned accordingly. It is also apparent that the waveguide segment 30' or the waveguides 32 and 34 can also be curved or have other shapes where appropriate.

The slotline 26 is also shown as a semi-circular formation for the reasons stated for the coplanar waveguide 30. In the slotline 26, care must be taken to provide a smooth transition along the slotline to reduce reflections or losses in redirecting the LO signal energy. The width dimensions of the slotline are determined by the frequencies and impedances employed for operation. A typical width for the slotline 26 is about 75 μm on a 0.25 mm thick GaAs substrate at 10 GHz.

The end of the waveguide 34 positioned on the interior portions of the substrate 22 is coupled electrically to the slotline 26 so that LO signals are fed into the diodes through this slotline section. One waveguide, here 30, introduces RF signals to the diodes via the coplanar waveguide sections 30a and 30b. The shape of the coplanar waveguide sections 30a and 30b, as previously stated, can be varied and depend on such factors as the areal constraints, diode locations, design rules, etc. These waveguides are coplanar and require no specialized isolation structures other than gaps in the surface metal 24.

The waveguide 34 is electrically coupled to the slotline 26 using airbridges, ribbons, or wires which bridge the slotline 26 at the appropriate central location. An airbridge type connection is preferred because of the ability to manufacture this structure during the overall monolithic circuit construction using conventional semiconductor fabrication techniques. A typical airbridge type connection is shown in FIG. 2 and in a more detailed sectional view in FIG. 5, which depicts a typical coplanar waveguide-to-slotline (34-to-26) T-junction.

The arcuate slotline 26 is terminated on each end by a pair of diodes which are connected across two narrow slots. D3 and D4 bridge or extend across the slots 38a and 38c while D1 and D2 bridge across the slots 38b and 38c. These slots are the ground separation gaps for the coplanar waveguide sections 30a and 30b, respectively. It should be noted that the polarity of the electrical charges are opposite on the opposite edges of the slotline 26. However, in the coplanar waveguide sections 30a and 30b, the ground potential is maintained by the conductive ribbons or bridges 50.

As shown in FIGS. 2 and 4, the signals presented along the waveguide 34 interact with the slotline 26 and launch traveling electromagnetic waves 56 along the slotline. This is represented in FIGS. 2 and 4 by the presence of positive and negative charges along the sides of the slotline 26, as deposited by the signals imposed on the waveguide 34, and the wave fronts 56, shown extending between the sidewalls of the slotline 26. The relative magnitude and exact polarity of charges and wavefronts are not illustrated but only their relative presence. The charge pattern along the slotline 26 is determined by the polarity of the LO signals traveling along the slotline 26 and relative transit times through the slotline.

The material extending between the coplanar waveguide 30 and the diode bridge points A, A', B, and B' form the RF transformer normally associated with the conventional multi-turn transformer coils or inductive loads 51, as shown in FIG. 3. The material extending between the coplanar waveguide 34 and the diode bridge points A, A', B, and B' form the LO transformers normally associated with the conventional multi-turn transformer coils 52 and 54, as shown in FIG. 3. The transition region between the waveguide 30 and the slotline 26 is tailored to be gradual enough to allow propagation of the desired LO signals across the region without substantial loss or reflection. Due to the high frequency nature of the RF and LO signals, the electromagnetic charges associated with these signals are mostly confined to the region in proximity to the coplanar waveguides and slotlines.

To prevent stray eddy currents and assure uniform RF ground, a series of one or more crossover bridges in the form of bond wires, ribbons, or airbridges 50 are generally provided across the center feed lines of the coaxial waveguides 30, 32, and 34. The crossovers on the RF circuit side of the mixer 20 also ensure that the island conductive surface 58 in the middle has the same RF and IF grounds as the rest of the DBM 20. It should be noted from FIG. 2 that the smallest planar dimension of conductive surface 58 is large relative to the width of slotline 56.

The mixer 20 is provided with the four diodes D1–D4 which form the star quad diode bridge configuration. For purposes of clarity, the diode connections are labeled A, A', B, and B' to correspond to the connections of Figure 1. As shown in FIG. 2, all four diodes are mounted or positioned substantially perpendicular to the slotline 26 and bridging the gap 38 between the inner conductor of the waveguide 30 and the ground plane. However, if they are mounted at other angles, the invention will still function but with less efficiency. The only requirement for the mixer to perform properly is that the polarities of the mounted diodes are such that they are turned on by the LO signal in pairs, i.e., if D2 and D4 are turned on during a given LO signal half-cycle then D1 and D3 are off, and visa versa.

The IF signal output for the DBM 20 is accomplished using a coplanar waveguide 32 which is connected to the RF input line, waveguide 30, near the waveguide 30 T-junction 36 using an airbridge 44. As shown in FIG. 2, a position along the waveguide 30 center conductor acts as a center tap for IF signal extraction, as in the conventional central node. The gold wires or ribbons 50 and metal 24 provide a continuous ground path for the IF signal from the diodes to the coplanar waveguide 32.

The exact position of the IF extraction tap depends on the amount of impedance or inductance desired relative to the central circuit connections of the diodes. Those skilled in the art will readily understand that the selection of the position depends on such factors as frequency of operation, impedance of the transmission line, and any areal constraint on the mixer. In general, the IF waveguide 32 contact should be placed as close to the junction 36 as possible without violating the electrical integrity of the coplanar waveguide 30.

A metal-insulation-metal (MIM) capacitor 42 should be placed or formed in the RF coplanar waveguide 30 center conductor in a position between the waveguide input and the IF connecting point to minimize IF signal loss to the RF port. Any LO signal leakage to the RF or IF port is cancelled in the waveguides due to phase cancellation. External lowpass filters can be used on the IF output conductor to prevent RF leakage.

Due to the uni-planar design of all transmission lines, the ground of the mixer is entirely on the front side of the substrate. If the bottom ground spacing (substrate thickness) is large enough, a back metal ground will have little effect on the mixer performance. Since there are no frequency dependent items in the mixer, the star-type DBM 20 should be broadband.

The RF, LO, and IF outputs of the mixer 20 are all coplanar which allows thin film fabrication using conventional semiconductor manufacturing techniques and facilitates evaluation of the mixer structure using high frequency on-wafer probes. This invention is ideal for many applications where low cost, small size, and high performance broadband double-balanced mixers are required. The invention can satisfy extensive requirements in a variety of communication, radar, missile sensor systems, etc.

For applications where the LO signal waveguide 34 is more conveniently located near one of the other edges of the substrate 22, alternate embodiments for the waveguide-to-slotline transition may be used. If it is desirable to have one end of the waveguide 34 positioned along another side of the substrate 22, due to the location of other circuit devices or conduction paths, the waveguide could be curved so that one end is still positioned near the central portion of the slotline 26 and an airbridge is still used for signal transfer. However, curved waveguides are not always preferred due to discontinuities. An alternate embodiment of a DBM allowing for these considerations is illustrated in FIG. 6.

Figure 6:
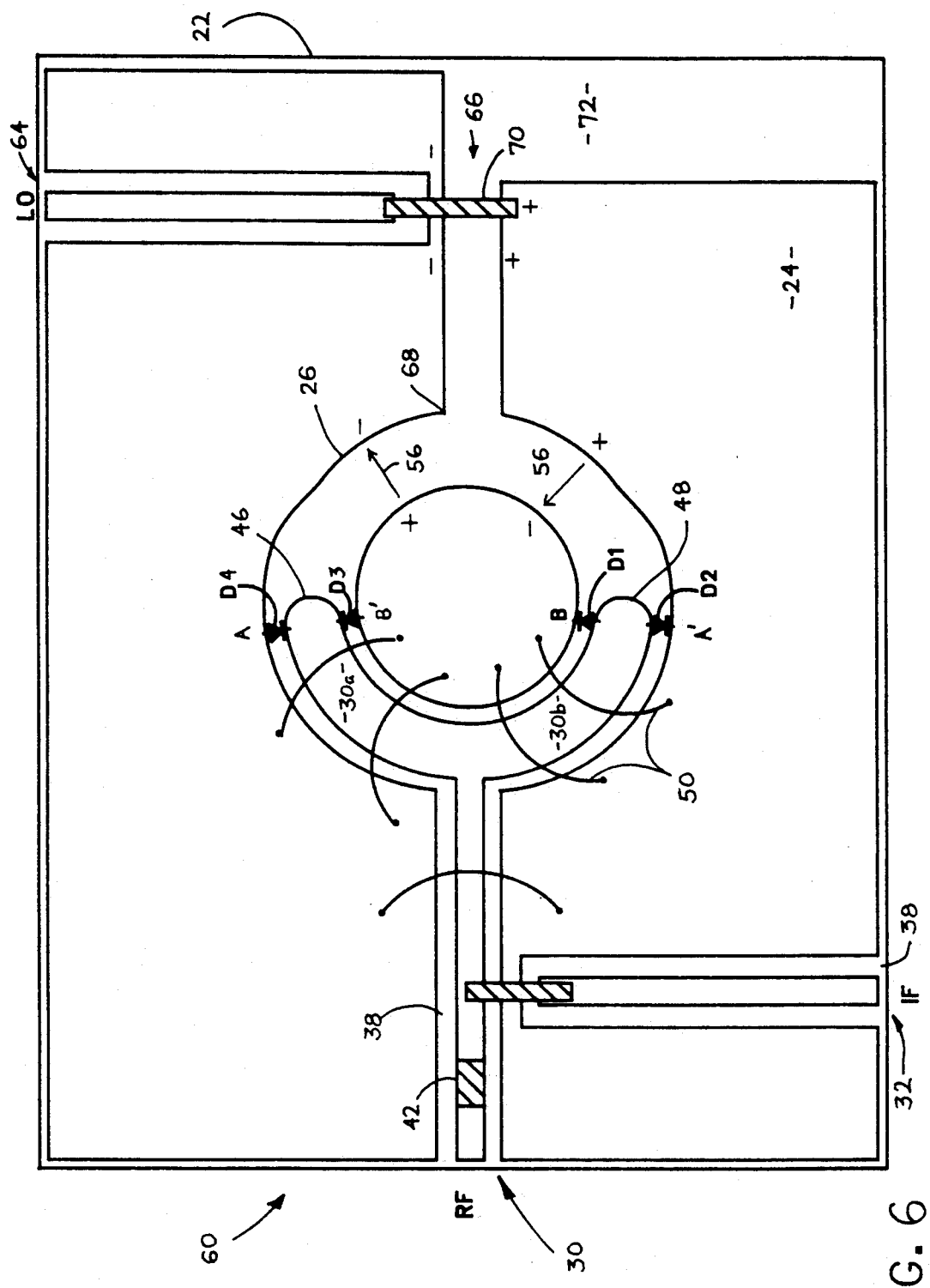
FIG. 6 illustrates an alternate embodiment for LO input where the LO input port is a coplanar waveguide.

In FIG. 6, a DBM 60 is shown having a conductive layer 24 positioned on a substrate 22 in the same manner as shown in FIG. 2. The waveguides 30 and 34 are configured in the same manner as shown in the mixer 20 of FIG. 2. However, the waveguide 34 is replaced with a coplanar waveguide 64 which is positioned to provide a lateral feed connection of the LO source to the slotline conductor 26.

A linear slotline 66 is connected on one end to the central potion of the slotline 26. The linear slotline 66 is connected to, and forms a part of, the slotline 26 at a T-junction 68. Signals launched down the slotline 66 make a transition to the slotline 26 and provide signals of approximately one-half strength to each of the outer ends of the slotline 26.

Figure 5:
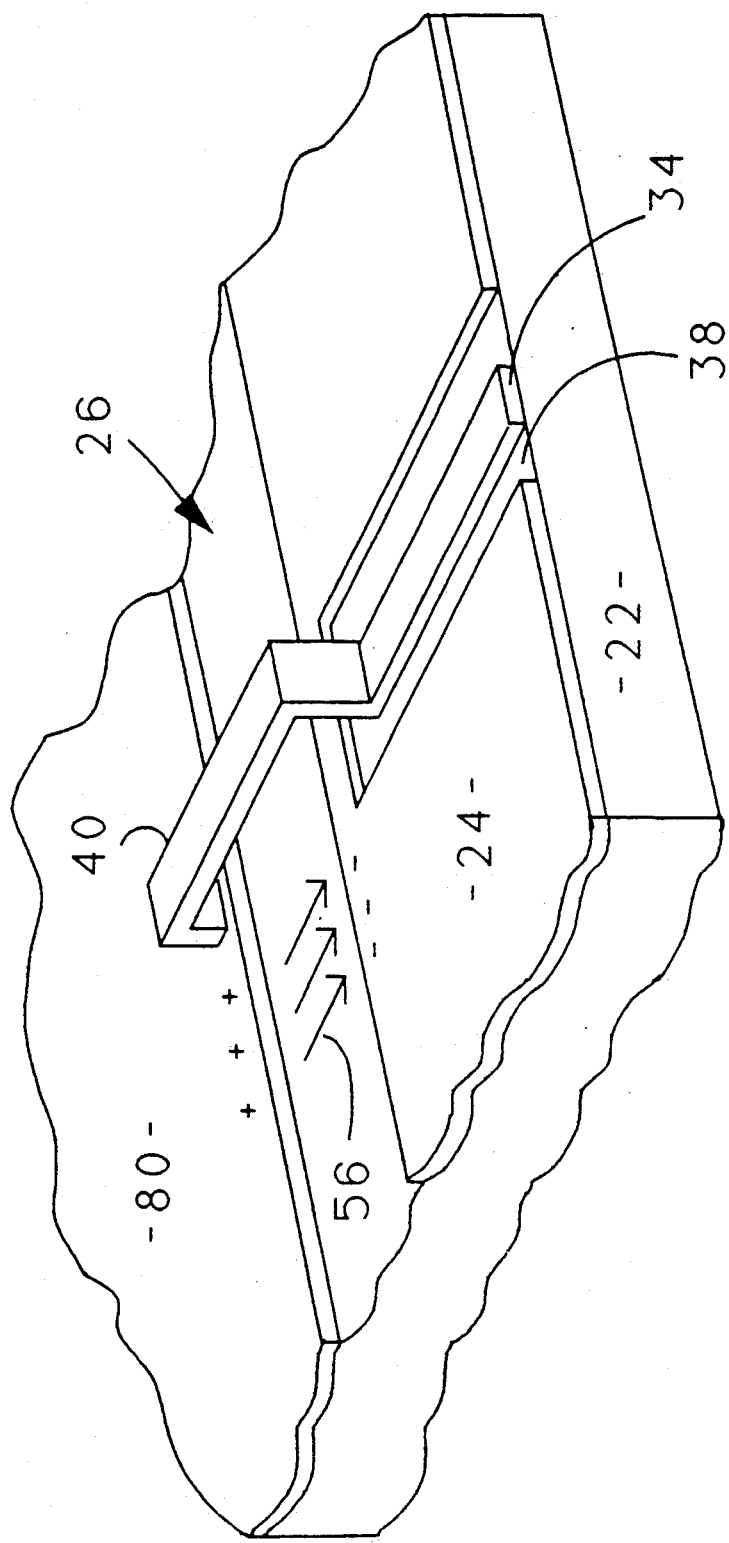
FIG. 5 illustrates a close up perspective view of a an airbridge connection used in the mixer of FIG. 2.

A coplanar waveguide-to-slotline transition 70 is used to electrically couple the waveguide 64 to the slotline 66. As previously discussed, a conductive crossover such as an airbridge, ribbon, or wire which bridge the slotline 66 at the appropriate transition location performs this function. An airbridge type connection is preferred because of the ability to manufacture this structure during the overall monolithic circuit construction using conventional semiconductor fabrication techniques. A typical airbridge type connection is shown in FIG. 5.

The linear slotline 66 is terminated on the end not connected to the slotline 26, at the junction 68, is by an open slotline or open end. That is, instead of extending the slotline 66 for a specified rectangular dimension and terminating it with a preselected impedance component, it is terminated into an open regions 72 in the conductive layer 24 in effect provides open termination. This provides an open circuit at the end of the slotline for good transition between the coplanar waveguide 64 and the slotline 66.

In general, the slotline 26 is usually wider than slotline 66 due to its higher impedance as in any T-junction design. For applications in which the slotline 26 is very wide (higher impedance), the arrangement in FIG. 6 is clearly more advantageous than that illustrated in FIG. 2, since the airbridge 70 now spans over a much narrower slotline (66) which improves mechanical strength and reliability. Since the polarities of the electromagnetic fields are reversed on the slotline 26 after being launched from the slotline 66, the diode pairs and their nodal equivalence to FIG. 1 are rearranged as in FIG. 6.

Except for this functional rearrangement, the operation of the mixer 60 is substantially the same as that of the mixer 20.

Figure 7:
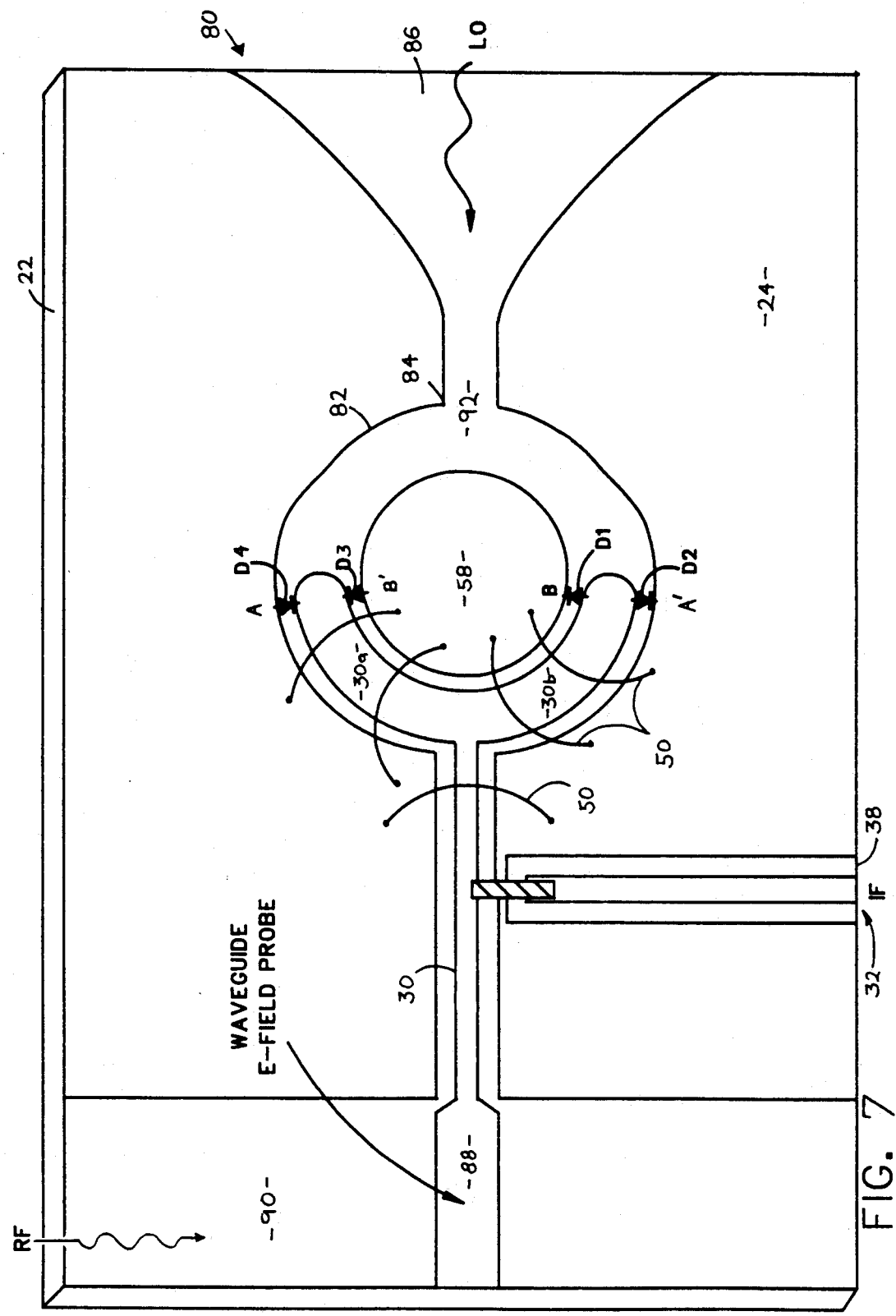
FIG. 7 illustrates a top view of another alternate embodiment for the double-balanced star mixer employing finline waveguide probe-type input.

For hybrid waveguide applications, where the mixer circuit must be installed inside a waveguide fixture such as those used in high millimeter-wave frequency applications, the DBM of the present invention may be reconfigured to provide the embodiment illustrated in FIG. 7.

In FIG. 7, a double-balanced star type mixer 80 is shown using an arcuate or semi-circular finline conductor 82 formed in a conductive material layer 24 on a substrate 22 in the same manner as previously discussed in relationship to the slotline 26 of FIGS. 2 and 6 above. However, instead of using a coplanar waveguide-to-slotline transition 40 or 70 for inputting LO signals, only finlines 82 and 86 are used. Those skilled in the art will know that a finline is a slotline that is inserted into the E-plane of a hollow metal waveguide. The finline is functionally equivalent to the slotline. Therefore, the operation of the mixer 80 is substantially the same as the mixer 60 except that the mixer 80 is inserted into a waveguide for very high frequency applications. That is, an opening 84 is positioned at a central position along the finline 82 and used for directly injecting LO signals into the finline 82. The LO signals are provided through the waveguide-to-finline transition 84 from a channel having a width that varies over its length between the dimension of the finline 82 where it joins the finline and the width of a source waveguide or capturing signal "horn" type input 86.

There should be no metal on the backside of the dielectric substrate 22, which is installed in a central position within an RF waveguide, not shown. The substrate 22 is installed so that the conductive layer 24 on the substrate is substantially parallel to, and resides in, the E-plane of the RF waveguide. In this suspended configuration, the slotline 26 becomes a conventional finline structure. The center conductor of the coplanar waveguide 30 is extended into, or otherwise connected to, an E-field probe 88 for RF coupling to the mixer. The RF signals are transferred through an RF channel 90 into which the filed probe 88 is inserted.

The conductive metal fins, electromagnetic ground for the finline and the coplanar waveguide are grounded to the conductive waveguide fixture used to provide RF and IF ground continuity. A suspended microstrip can then be used to connect the IF output waveguide 32 to a conventional connector, e.g. SMA connector, for IF extraction.

This invention is ideal for many applications where low cost, small size, and high performance broadband double-balanced mixers are required. The invention can satisfy extensive requirements in a variety of communication, radar, and missile sensor systems.

The foregoing description of preferred embodiments has been presented for purposes of illustration and description. It is not intended to be exhaustive nor to limit the invention to the precise forms disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. A passive uniplanar double-balanced star RF mixer, comprising:
   a substantially planar support substrate;
   a conductive layer of material disposed on one side of said substrate;
   a slotline formed in said conductive layer having first and second ends;
   a first coplanar bifurcated waveguide formed in said conductive layer having a first waveguide segment configured to transfer signals in a first preselected frequency range which branches into second and third waveguide segments on one end which form first and second waveguide terminations each physically coupled to one of said slotline ends;
   a second planar waveguide formed in said conductive layer having a center feed strip electrically coupled to said first waveguide segment at a position removed a predetermined distance from said branches, and being configured to transfer signals in a second preselected frequency range;
   a capacitor in the first waveguide at a location further from said branches than the second waveguide;
   a third coplanar waveguide formed in said conductive layer having a center feed strip electrically coupled to said slotline at a position located approximately equi-distant from said slotline ends, and being configured to transfer signals in a third preselected frequency range;
   first ground means connected to a ground common to each of said first and third coplanar waveguides for providing a common ground path therebetween;
   second ground means connected to a ground common to each of said second and third coplanar waveguides for providing a common ground path therebetween;
   a first diode connected by a cathode to said first waveguide center conductor adjacent said first termination and at an anode to said first ground means;
   a third conductive surface enclosed by said slotline and said first waveguide branches;
   a second diode connected by a cathode to said first waveguide center conductor adjacent said first termination and at an anode to said enclosed third conductive surface;
   a third diode connected by an anode to said first waveguide center conductor adjacent said second termination and at a cathode to said second ground means;
   a fourth diode connected by an anode to said first waveguide center conductor adjacent said second termination and at a cathode to said enclosed surface;
   said first ground means comprises a first conductive surface area on said substrate positioned adjacent to and extending between said first and third coplanar waveguides, and positioned adjacent to said first termination;
   said second ground means comprises a second conductive surface area on said substrate positioned adjacent to and extending between said second and third coplanar waveguides, and adjacent to said second termination; and
   said enclosed conductive surface having its smallest planar dimension large relative to the width of said slotline which is further connected to said first and second ground means across said coplanar waveguide branches, but not across the slotline.

2. The double-balanced RF mixer apparatus of claim 1 further comprising a plurality of spaced apart electrically conductive crossovers connected between said first and second conductive surface areas and said enclosed conductive surface area adjacent to said first waveguide.

3. The double-balanced RF mixer apparatus of claim 2 wherein said crossovers comprise gold ribbons.

4. The double-balanced RF mixer apparatus of claim 1 wherein said second and third waveguide segments each extend at an angle of 90 degrees or less from said first segment toward said slotline each segment being linear.

5. The double-balanced RF mixer apparatus of claim 4 further comprising fourth and fifth linear waveguide segments connected to said second and third waveguide segments, respectively, at an angle of 90 degrees or less toward said slotline.

6. The double-balanced RF mixer apparatus of claim 1 wherein said first waveguide segment is linear and said first bifurcated waveguide branches each comprise an arcuate waveguide segment connected on one end to said first linear waveguide segment.

7. The double-balanced RF mixer apparatus of claim 6 wherein said arcuate waveguide segments are elliptical segments.

8. The double-balanced RF mixer apparatus of claim 1 further comprising a capacitor of predetermined value disposed in series with said center conductor of said first coplanar waveguide.

9. The double-balanced RF mixer apparatus of claim 1 wherein said second coplanar waveguide comprises a bridge of conductive material connected on one end to said center feed of said second coplanar waveguide and on a second end to said first waveguide center conductor.

10. The double-balanced RF mixer apparatus of claim 1 wherein said third coplanar waveguide comprises a bridge of conductive material having one end connected to a center feed of said third waveguide, a central portion extending over said slotline, and a second end connected to said enclosed conductor.

11. The double-balanced RF mixer apparatus of claim 1 wherein said substrate comprises gallium arsenide.

12. The double-balanced RF mixer apparatus of claim 1 wherein said substrate comprises insulating material.

13. The double-balanced RF mixer apparatus of claim 12 wherein said insulating material comprises a ceramic.

14. The double-balanced RF mixer apparatus of claim 1 wherein said conductive layer comprises a material chosen from the group of silver, platinum/gold alloy, titanium/ gold alloy, chrome/gold alloy, and gold.

15. The double-balanced RF mixer apparatus of claim 1 wherein said slotline is an arcuate slotline.

16. The double-balanced RF mixer apparatus of claim 15 wherein said arcuate slotline has an elliptical configuration.

17. The double-balanced RF mixer apparatus of claim 1 wherein said slotline comprises first and second linear slotline segments connected on one end to said second and third waveguide segments, respectively, and to each other on a second end at an angle of 90 degrees or less.

18. The double-balanced RF mixer apparatus of claim 17 wherein said slotline further comprises third and fourth near slotline segments secured in series between said first and second waveguide segments and said first and second slotline segments, respectively, and join to said first and second slotline segments.

19. A passive uniplanar double-balanced star RF mixer, comprising;

a substantially planar support substrate;

a first conductive layer of material disposed on one side of said substrate;

a finline formed in said conductive layer having first and second ends;

a first coplanar bifurcated waveguide formed in said conductive layer having a waveguide segment configured to transfer signals in a first preselected frequency range which branches into two waveguide segments on one end which form first and second waveguide terminations each physically coupled to one of said finline ends;

a second coplanar waveguide formed in said conductive layer having a center feed strip electrically coupled to said first waveguide segment at a position removed a predetermined distance from said branches, and being configured to transfer signals in a second preselected frequency range;

a tapered finline formed in said conductive layer having a wide first end and a narrower second end which is connected to said first mentioned finline at a position located approximately equi-distant from said finline ends, and being configured to transfer signals in a third preselected frequency range;

a waveguide E-Field probe connected to said first waveguide on a second end as an input;

first ground means connected to a ground of each of said first coplanar waveguide and said first mentioned finline for providing a common ground path therebetween;

second ground means connected to a ground of said second coplanar waveguide and said first mentioned finline for providing a common ground path therebetween;

a first diode connected by a cathode to said first coplanar waveguide center conductor adjacent said first termination and at an anode to said first ground means;

a conductive surface enclosed by said first mentioned finline and said waveguide branches;

a second diode connected by a cathode to said first coplanar waveguide center conductor adjacent said first termination and at an anode to said enclosed surface;

a third diode connected by an anode to said first coplanar waveguide center conductor adjacent said second termination and at a cathode to said second ground means;

a fourth diode connected by an anode to said first coplanar waveguide center conductor adjacent said second termination and at a cathode to said enclosed conductive surface;

said first ground means comprises a first conductive surface area on said substrate positioned adjacent to and extending between said first waveguide and said tapered finline waveguide, and positioned adjacent to said first termination;

said second ground means comprises a second conductive surface area on said substrate positioned adjacent to and extending between said second waveguide and said tapered finline waveguide, and adjacent to said second termination; and said enclosed conductive surface having its smallest planar dimension large relative to the width of said finline slot which is further connected to said first and second ground means across said coplanar waveguide branches, but not across the slot of the first mentioned finline.

* * * * *